(12) United States Patent
Peng et al.

(10) Patent No.: US 10,510,922 B2
(45) Date of Patent: Dec. 17, 2019

(54) GROUP III-V QUANTUM DOT AND MANUFACTURING METHOD THEREOF

(71) Applicants: Zhejiang University, Hangzhou (CN); Najing Technology Corporation Ltd., Hangzhou (CN)

(72) Inventors: Xiaogang Peng, Hangzhou (CN); Yang Li, Hangzhou (CN)

(73) Assignees: Zhejiang University, Hangzhou (CN); Najing Technology Corporation Ltd., Hangzhou (CN)

(*) Notice: Subject to any disclaimer, the term of this patent is extended or adjusted under 35 U.S.C. 154(b) by 0 days.

(21) Appl. No.: 15/949,849

(22) Filed: Apr. 10, 2018

(65) Prior Publication Data
US 2018/0301592 A1    Oct. 18, 2018

Related U.S. Application Data

(60) Provisional application No. 62/484,711, filed on Apr. 12, 2017.

(51) Int. Cl.
| | |
|---|---|
| *H01L 29/06* | (2006.01) |
| *H01L 33/00* | (2010.01) |
| *H01L 33/06* | (2010.01) |
| *H01L 33/28* | (2010.01) |
| *H01L 33/30* | (2010.01) |
| *C09K 11/00* | (2006.01) |
| *C09K 11/02* | (2006.01) |
| *C09K 11/56* | (2006.01) |
| *C09K 11/70* | (2006.01) |
| *C09K 11/88* | (2006.01) |

(52) U.S. Cl.
CPC ......... *H01L 33/0062* (2013.01); *C09K 11/00* (2013.01); *C09K 11/02* (2013.01); *C09K 11/565* (2013.01); *C09K 11/70* (2013.01); *C09K 11/883* (2013.01); *H01L 33/002* (2013.01); *H01L 33/0083* (2013.01); *H01L 33/06* (2013.01); *H01L 33/28* (2013.01); *H01L 33/30* (2013.01)

(58) Field of Classification Search
CPC ... H01L 33/06; H01L 33/28; H01L 21/02601; H01L 31/035218
See application file for complete search history.

(56) References Cited

U.S. PATENT DOCUMENTS

| | | | |
|---|---|---|---|
| 9,577,149 B2* | 2/2017 | Lu | C30B 7/08 |
| 2010/0090164 A1* | 4/2010 | Peng | C09K 11/02 |
| | | | 252/301.4 R |
| 2012/0205586 A1* | 8/2012 | Ren | C01B 25/08 |
| | | | 252/301.36 |
| 2015/0041759 A1* | 2/2015 | Kahen | C09K 11/00 |
| | | | 257/13 |

* cited by examiner

*Primary Examiner* — Hsien Ming Lee
(74) *Attorney, Agent, or Firm* — Osha Liang LLP (57) ABSTRACT

Embodiments disclosed herein relate to group III-V QDs and manufacturing methods thereof. More specifically, the embodiments disclosed herein relate to group III-V QDs that have at least one shell of a group II-VI compound surrounding the group III-V QD core. Thus, the QDs disclosed herein are core/shell QDs and in some embodiments may be a core/shell/shell QD. For example, the group III-V QD core material may be surrounded by a shell of a group II-VI compound, which itself may be surrounded by a shell of a group II-VI compound.

21 Claims, 8 Drawing Sheets

GROUP III-V QUANTUM DOT AND MANUFACTURING METHOD THEREOF

CROSS-REFERENCE TO RELATED APPLICATIONS

This Application claims priority to U.S. Provisional Patent Application No. 62/484,711 filed on Apr. 12, 2017, which is incorporated herein by reference.

BACKGROUND

Quantum dots (QDs or QD for a singular dot) are semiconductor nanocrystals with their sizes in the quantum-confinement regime. QDs can emit light of specific frequencies if they have electricity or light applied to them, and the particular frequencies emitted may be tuned by changing one or more of the quantum dots size, shape, or material composition. The tunable electronic/emission properties of QDs make them commercially interesting for a variety of applications including transistors, solar cells, LED's, diode lasers and second harmonic generation, quantum computing, and medical imaging among others.

Group quantum dots, (i.e., QDs having elements from groups III and V of the Periodic Table of the Elements) are interesting materials for commercial applications because of their emission and electronic properties, and because they may have low toxicity, owing to being cadmium, lead and mercury free. However, in comparison to commonly used cadmium-based QDs, group III-V QDs tend to have lower photoluminescence (PL) quantum yield, more photochemical and chemical instability, and a broader and less homogenous PL peak, properties that are major challenges for their wide commercial application.

SUMMARY

This summary is provided to introduce a selection of concepts that are further described below in the detailed description. This summary is not intended to identify key or essential features of the subject matter, nor is it intended to be used as an aid in limiting the scope of the subject matter.

Embodiments disclosed herein relate to group III-V quantum dots and manufacturing methods thereof.

In certain aspects, embodiments disclosed herein relate to a process for producing group III-V quantum dots that includes heating a mixture of group II and group III element precursors in a solution; adding a group V element precursor to the mixture and heating to form a first solution containing group III-V quantum dot cores; adding a first group VI element precursor to the first solution to form group III-V/group II-VI core/shell particles; purifying the group III-V/group II-VI core/shell particles; dispersing the purified group III-V/group II-VI core/shell particles in a second solution; adding activation agent and a group II element precursor to the second solution; heating the second solution; and adding a second group VI element precursor to the heated second solution.

In another aspect, embodiments disclosed herein relate to group III-V quantum dots, comprising: core/shell quantum dots produced by a process, comprising: heating a mixture of group II and group III element precursors in a solution; adding a group V element precursor to the mixture and heating to form a first solution containing group III-V quantum dot cores; adding a first group VI precursor to the first solution to form group III-V/group II-VI core/shell particles; purifying the group III-V/group II-VI core/shell particles; dispersing the purified group III-V/group II-VI core/shell particles in a second solution; adding activation agent and a group II element precursor to the second solution; heating the second solution; and adding a second group VI element precursor to the heated second solution.

Other aspects and advantages of the subject matter will be apparent from the following description and the appended claims.

DETAILED DESCRIPTION

Embodiments disclosed herein relate to group III-V QDs and manufacturing methods thereof. More specifically, the embodiments disclosed herein relate to group III-V QDs that have at least one shell of a group II-VI compound surrounding the group III-V QD core. Thus, the QDs disclosed herein are core/shell QDs and in some embodiments may be core/shell/shell QDs. For example, the group III-V QD core material may be surrounded by a shell of a group II-VI compound, which itself may be surrounded by a shell of a group II-VI compound.

In one or more embodiments, a general method for synthesizing a group III-V QD according to the present disclosure may include forming group III-V QD cores, forming a thin shell of a group II-VI compound on the group III-V QDs, purifying the group III-V QDs having a thin shell of a group II-VI compound thereon, forming a thick shell of a group II-VI compound on the thin shell of the group III-V QDs, purifying the group III-V QDs having a thick shell of a group II-VI compound on the thin shell of the group III-V QDs, and forming a shell of a different group II-VI compound on the thick group II-VI shell of the group III-V QDs.

In one or more embodiments, the group III-V QD cores may be formed under the condition that group II ions are present in the reaction medium during their formation. In one or more embodiments, the group III-V QD cores may be formed without group II ions being present in the reaction medium during the formation and then purified to remove excess group III ions from the reaction medium before shell growth, then group II ions may be added after the core purification and used for growth of a group II-VI shell. Without being bound by a particular theory, it is believed that the purifying steps in the general method described above (and below) lessens the possibility for group III-ion contamination during the growth of the subsequent shells of group II-VI compound. When not removed, these group III-ions can serve as electronic traps that decrease the PL properties of the resulting QDs. Thus, the removal of excess group III ions from the reaction medium can improve II-IV shell growth and the PL properties of the resulting QDs and any procedure that can fulfill this goal may be applied to replace the purification processes described herein.

Figure 1:
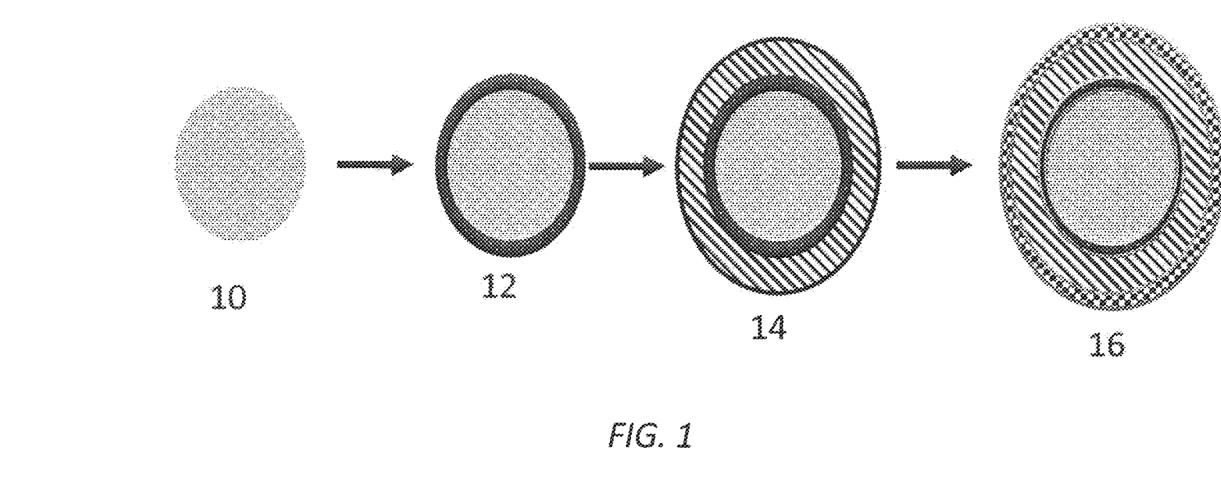
FIG. 1 depicts a graphical representation of particles resulting from each step in a general synthesis method for group III-V QDs according to one or more embodiments of the present disclosure.

FIG. 1 depicts a graphical representation of the particles resulting from each step in the general method described above. The initially formed group III-V QD is shown as 10, the group III-V QD having a thin shell of a group II-VI compound thereon is shown as 12, the group III-V QD having a thick shell of a group II-VI compound around the thin shell of a group II-VI compound is shown as 14, and the group III-V QD having a shell of a group II-VI compound around the thick and inner thin shell is shown as 16. In one or more embodiments, the "thick" and the "thin" shells may be compositionally the same material but may be formed in distinct steps. In general, the shells are formed epitaxially in a layer by layer manner upon the surface and therefore any material that is capable of epitaxial growth on the surface present may be used as a shell material.

In the embodiments disclosed above, the group II-VI compounds used as the shell materials (e.g., the thick/thin shells) may be the same composition or they may be different group II-VI compounds. In one or more embodiments, the thin shell formed directly around the group III-V QD core and the thick shell formed directly on the thin shell may be the same group II-VI compound. However, the shell formed directly on the thick shell is a different group II-VI compound than the thick shell group II-VI compound. In one or more embodiments, a "thin" shell may be less than about 4 monolayers of shell material. In contrast, a "thick" shell may be more than about 4 monolayers of shell material.

Figure 2:
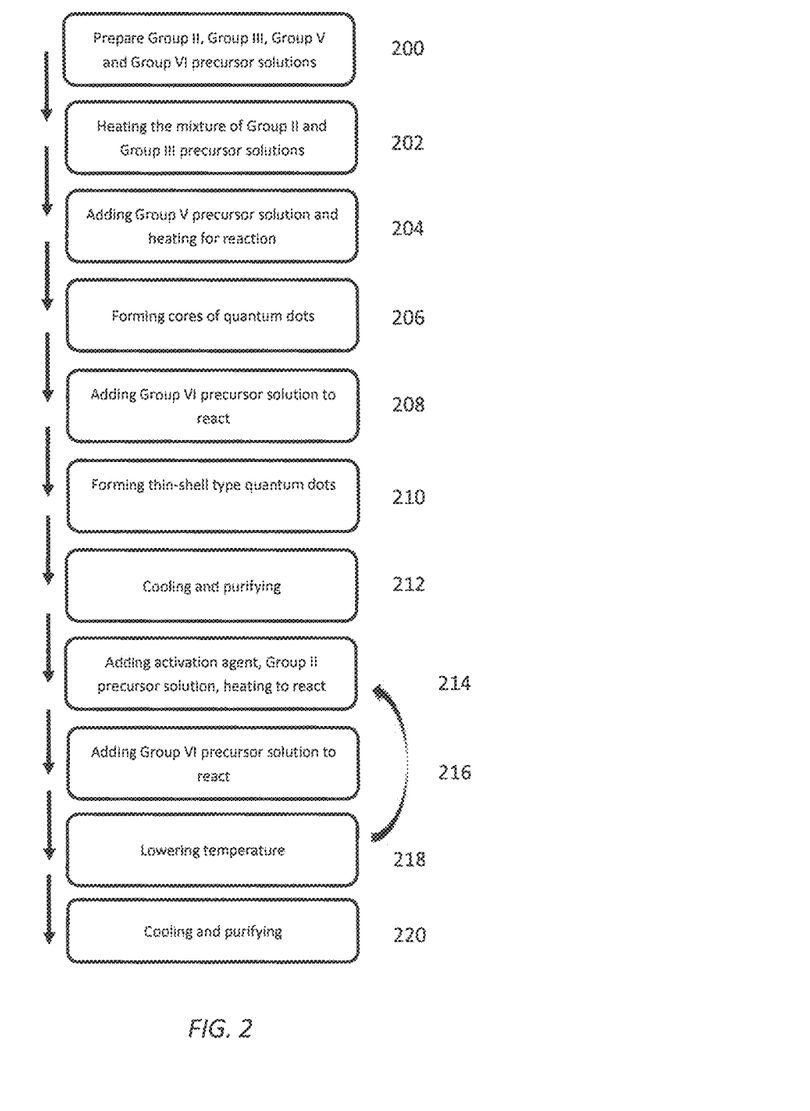
FIG. 2 depicts a block diagram of a synthesis strategy for making group III-V QDs according to one or more embodiments of the present disclosure.

FIG. 2 depicts a flow chart for a method of forming group III-V QDs according to one or more embodiments of the present disclosure. In 200, precursor solutions of group II, group III, group V, and group VI precursors are prepared. In one or more embodiments, the precursors are compounds that contain a group II or group III cation along with an anionic species to balance the charge or a group V or group VI anion along with a cationic species to balance the charge. In one or more embodiments, the precursor solutions may be formulated by dissolving/dispersing a precursor material in a non-coordinating organic solvent: such as a C6-C40 aliphatic hydrocarbon (e.g., hexadecane, octadecene, and squalene). In one or more embodiments, the concentration of the precursor in the final reaction mixture(s) may be from about 0.01 to 1 mol/L. In some embodiments, one or more of the precursors may not be prepared as a solution and instead, may remain in a dry form.

In 202, a mixture of group II and group III precursor solutions are heated. In one or more embodiments the molar ratio of group II element to group III element in the mixture may be between 100:1 and 1:1, or between 50:1 and 1:1, or between 25:1 and 1:1; or between 10:1 and 1:1; or between 5:1 and 1:1. In one or more embodiments, the molar ratio of group II element to group III element in the mixture may be about 10:1, or 4:1, or 1:1, or 1:2.

In 204, group V precursor solution is added to the mixture in 202 and heating is begun for reaction. In one or more embodiments the molar ratio of group III element to group V element in the mixture may be between 100:1 and 1:1, or between 50:1 and 1:1, or between 25:1 and 1:1; or between 10:1 and 1:1; or between 5:1 and 1:1. In one or more embodiments, the molar ratio of group III element to group V element in the mixture may be about 8:1, or 4:1, or 2:1, or 1:1. In one or more embodiments, the solution in 204 may be heated to about 50-200° C. or to about 80-150° C. either before or after the addition of the group V precursor solution.

In 206, the group III-V QD cores are formed as a result of the heating. In one or more embodiments, the molar amounts of the group III and group V precursors that are added to the reaction mixture may be about equal to ensure stoichiometric equivalence between the group III and group V elements. Thus, stoichiometric group III-V QD cores may be formed (e.g., InP, GaN, AlN, and other III-V materials). It is believed that the group II precursor present in the reaction mixture may act as ligands for the group III-V QD cores that are formed. For example, the group II species in the precursor may be a cation that can act as a ligand by interacting with any anions present on the surface of the group III-V QD cores, thereby serving to stabilize the cores. In the absence of the group II species, the group III species on the QD cores may dominate the near surface environment by binding or interacting with three −1 valence anions which may be the counter ions from the precursor compound. This binding or interaction can be very strong and can disrupt and affect later shell growth in a detrimental fashion by blocking access to the surface for the group II and group VI components needed for shell growth. When the group II species is present in the reaction mixture at the outset, it can interact at the surface of the QD cores with anions of the QD cores and also counter anions (e.g., those sourced from the precursor compounds) in solution near the surface of the QD cores. This activity by the group II species may effectively prevent the group III cations from strongly binding three −1 valence anions near the QD core surface, which in turn makes the surface of the QD cores more amenable to the shell forming reaction. For example, the stabilization by the group II element may facilitate the shell formation reaction on the QD cores by making it easier for the subsequently added group VI species (added in 208 below) to access the surface and react due to the surface having less concentrated group III species and anion binding there.

In 208, group VI precursor solution is added to react with the group II precursor compound in solution or acting as ligands on the group III-V cores. In one or more embodiments the molar ratio of group III-V cores to group VI element added may be between 1:100 and 1:20,000, or between 1:500 and 1:10,000, or between 1:1,000 and 1:5,000. The concentration of the group III-V cores may be calculated by using the Beer-Lambert law, which is well known to relate the absorbance value obtained experimentally to the concentration of a sample measured. In one or more embodiments, the temperature of the solution in 208 may be heated to about 200-360° C. or from about 240-300° C. either before or after the addition of the group VI precursor solution. In 210, the thin shell of group II-VI compound is formed on the group III-V QD cores.

In 212, the reaction solution is cooled and the purification of the group III-V QDs having a thin shell of a group II-VI compound thereon is performed. In one or more embodiments, the purification may include adding hexane (and/or toluene), methanol (and/or ethanol) and an aliphatic amine to the solution with mixing. The mixing may then be stopped and the methanol phase (the lower phase) may be separated after phase separation of the mixed solution. In one or more embodiments, the same purification may be performed a second time with or without the addition of the aliphatic amine. In one or more embodiments, the aliphatic amine may be a C6 to C22 primary alkylamine, such as octylamine or oleylamine. It is believed that the aliphatic amine may be able to effectively solubilize or otherwise render the unreacted precursors removable from the QDs during the purification process. Acetone may be added to complete the precipitation of the QDs from the remaining hexane. There is no particular limit to the amount of times that the purification process of the QDs may be performed as long as the purification does not damage, etch, or otherwise destroy the integrity of the QDs. In one or more embodiments, the purification process may be performed between 1 and 4 times. In one or more embodiments, centrifugation may be used to separate the QDs from a supernatant solution that may include at least one of the liquids used in the purification. Hexane, acetone, or a combination of both may be added to the precipitate so that it may be dispersed and centrifuged again to further purify the QDs. As mentioned above, these steps may be repeated as necessary to remove contaminants and excess ions from the QDs. In one or more embodiments, the purification process may also utilize column chromatography, capillary electrophoresis, or other similar methods.

In 214, activation agents (e.g, fatty acids or diketones or both) and group II precursor solution is added to the purified QDs and the mixture is heated to react. In one or more embodiments, the heating may occur before or after the addition of the activation agent and/or the group II precursor solution. In one or more embodiments, the activation agent may be a fatty acid or a diketone (e.g. acetylacetone and its derivatives. In one or more embodiments, the chemical formula of the acetylacetone derivatives may be:

wherein P1, P2, and P3 may be independently selected from an alkyl group, an alkyl group having substituent, an alkenyl group, an alkenyl group having substituent or an aryl group. Further, in one or more embodiments, P1 may be hydrogen. In one or more embodiments, the concentration of activation agent added to the purified QDs is about 100-10,000 times or 100-1000 times the concentration of the QD cores present. In one or more embodiments, the amount (molar) of the activation agent added to the purified QDs is about 2-20 times the amount of group V precursor used to the form the QD cores. It is believed that the activation agent may facilitate growing a thick group II-VI shell by helping to loosen any surface ligands that may impede shell growth and also because the activation agent may selectively dissolve any group II-VI clusters that may form in solution through homogenous nucleation.

In one or more embodiments, the activation agent and group II precursor solution are added to the purified QDs in a non-coordinating organic solvent: such as a C6-C40 aliphatic hydrocarbon (e.g., hexadecane, octadecene, and squalene). In one or more embodiments, the fatty acids may be selected from at least one of acetic acid, butyric acid, caproic acid, octanoic acid, capric acid, lauric acid, myristic acid, palmitic acid, stearic acid, undecylenic acid, arachidic acid, behenic acid and oleic acid. In one or more embodiments, the mixture is heated to about 200-360° C. or to about 240-300° C. to react after the addition.

In 216, group VI precursor solution is added to the heated mixture to react, forming the thicker group II-VI shell on the QDs obtained in 210 (i.e. the QDs already having a thin II-VI shell on a III-V core). In one or more embodiments, about one or two monolayers of the group II-VI shell may be formed at a time on the QDs obtained in 210. This may be accomplished by modulating the amount of group II and group VI precursor added during 214 and 216. In one or more embodiments, the mixture is heated to about 200-360° C. or to about 240-300° C. to react after the addition.

The flow chart depicts that at 218 one may return to 214 for growing more monolayers of the shell. That is the sequence beginning at 214 may be repeated to grow thicker shells of II-VI material. This may be useful when forming 1-2 monolayers of group II-VI shell at a time. It may be difficult to form a thick shell in one sequence of 214-218 as the use of larger amounts of reagents necessary to form a thick shell may lead to non-specific nucleation in solution, rather than controlled shell growth on the QDs already present in the solution (e.g., QDs from either 210 or 218 if the sequence is repeated). In one or more embodiments, the reaction mixture may be cooled without purification and the temperature cycling/reagent addition depicted in 214-218 may be repeated in order to grow a thicker shell on the QDs. Conversely, or once the desired thickness of the shell has been achieved, one may proceed directly to 220 from 218 and lower the temperature to halt the reaction before purification of the final product in 220. Regardless, when repeating the addition of activation agent and group II precursor in 214 the mixture may be cooled to less than 180° C. to prevent premature reaction. In one or more embodiments, the mixture is heated to about 200-360° C. or to about 240-300° C. to react after the addition of activation agent. In one or more embodiments, when repeating and cycling between 214 and 218, one may change the group II precursor and the group VI precursor from what was previously used in order to form a chemically distinct shell.

In one or more embodiments, the concentration of the precursors used (e.g., the group II, group III, group V, and group VI precursors) during the synthesis of the QDs may be from about 0.01 to 1 mol/L with respect to the final solution they are added into before reacting. One will understand that stoichiometric ratios may be used during the synthesis to reduce the amount of excess ions present in the reaction mixtures.

In one or more embodiments, the group III element in the group III-V QD may be at least one element selected from aluminum (Al), gallium (Ga), and indium (In). In one or more embodiments, the group III element may be provided by at least one precursor compound selected from aluminum phosphate, aluminum acetylacetonate, aluminum chloride, aluminum fluoride, aluminum oxide, aluminum nitrate, aluminum sulfate, aluminum carboxylate, gallium acetylacetonate, gallium chloride, gallium fluoride, gallium oxide, gallium nitrate, gallium sulfate, gallium carboxylate, trimethyl indium, indium acetate, indium chloride, indium bromide, indium iodide, indium acetylacetonate, indium oxide, indium nitrate, indium sulfate, and indium carboxylate.

In one or more embodiments, the group V element in the group III-V QD may be at least one element selected from nitrogen (N), phosphorus (P), and arsenic (As). In one or more embodiments, the group V element may be provided by at least one precursor compound selected from alkyl phosphine, tris(trialkylsilyl) phosphine, tris(dialkylsilyl) phosphine, tris(dialkylamino) phosphine, tris(trialkylsilyl) arsine, tris(dialkylsilyl) arsine, tris(dialkylamino) arsine.

In one or more embodiments, the core of the group III-V QD may be a binary element compound selected from GaN, GaP, GaAs, GaSb, AlN, AlP, AlAs, AlSb, InN, InP, InAs, InSb, and a mixture thereof, a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and a quaternary element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

In one or more embodiments, the core of the group III-V QD may have a diameter less than about 20 nm, or less than about 10 nm, or less than about 9 mm, or less than about 8 nm, or less than about 7 nm, or less than about 6 nm, or less than about 5 nm, or less than about 4 nm, or less than about 3 nm, or less than about 2 nm. In one or more embodiments, the core of the group III-V QD may have a diameter greater than about 1 nm, or greater than about 0.5 nm.

In one or more embodiments, the group II element in the group II-VI shell(s) may be at least one element selected from zinc (Zn), and cadmium (Cd). In one or more embodiments, the group II element may be provided by at least one precursor compound selected from zinc acetate, dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, cadmium oxide, dimethyl cadmium, diethyl cadmium, cadmium carbonate, cadmium acetate dihydrate, cadmium acetylacetonate, cadmium fluoride, cadmium chloride, cadmium iodide, cadmium bromide, cadmium perchlorate, cadmium phosphide, cadmium nitrate, cadmium sulfate, cadmium carboxylate.

In one or more embodiments, the group VI element in the group II-VI shell(s) may be at least one element selected from sulfur (S), selenium (Se), and tellurium (Te). In one or more embodiments, the group VI element may be provided by at least one precursor compound selected from sulfur powder, trialkylphosphine sulfide, trialkenylphosphine sulfide, triphenylphosphine sulfide, diphenylphosphine sulfide, phenylphosphine sulfide, alkylamino sulfide, alkenylamino sulfide, alkylthiol, selenium powder, trialkylphosphine selenide, trialkenylphosphine selenide, triphenylphosphine selenide, diphenylphosphine selenide, phenylphosphine selenide, alkylamino selenide, alkenylamino selenide, trialkylphosphine telluride, trialkenylphosphine telluride, alkylamino telluride, and alkenylamino telluride. In one or more embodiments, a group VI precursor solution may be a selenium and/or sulfur powder suspension in a non-coordinating organic solvent, such as a C6-C40 aliphatic hydrocarbon. For example, a selenium and/or sulfur powder suspension in at least one of hexadecane, octadecene, and squalene may be used.

In one or more embodiments, the QDs of the present application are InP/ZnSe/ZnS core/shell/shell quantum dots. In one or more embodiments, the QDs of the present application are InAs/ZnSe/ZnS core/shell/shell quantum dots. In one or more embodiments, the QDs of the present application are InP/GaP/ZnS core/shell/shell quantum dots. In one or more embodiments, the QDs of the present application are InAs/InP/ZnSe/ZnS core/shell/shell/shell quantum dots. In one or more embodiments, the QDs of the present application are InP/GaP/ZnSe/ZnS core/shell/shell/shell quantum dots. In one or more embodiments, the ZnS shell of the InP/ZnSe/ZnS QDs may have a thickness of 3 monolayers or more. In one or more embodiments, the QDs of the present application may have a peak in the photoluminescence (PL) spectra that exhibits a peak with a full width at half-maximum (FWHM) intensity of less than about 55 nm, or less than about 50 nm, or less than about 45 nm, or less than about 40 nm, or less than about 38 nm, or less than about 35 nm, or less than about 30 nm. In one or more embodiments, the QDs of the present application may exhibit single-exponential PL decay dynamics.

EXAMPLES

Figure 3:
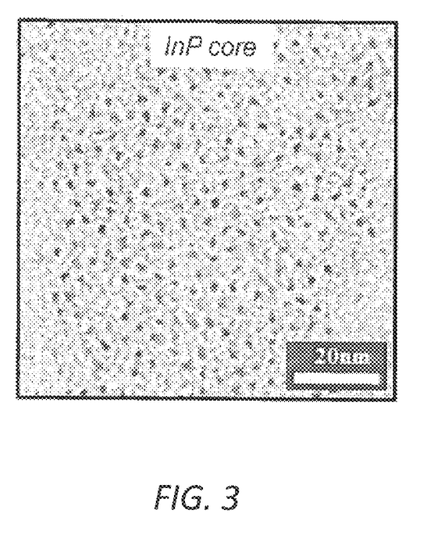
FIG. 3 is a transmission electron microscope (TEM) image of the InP core particles from the examples.
Figure 4:
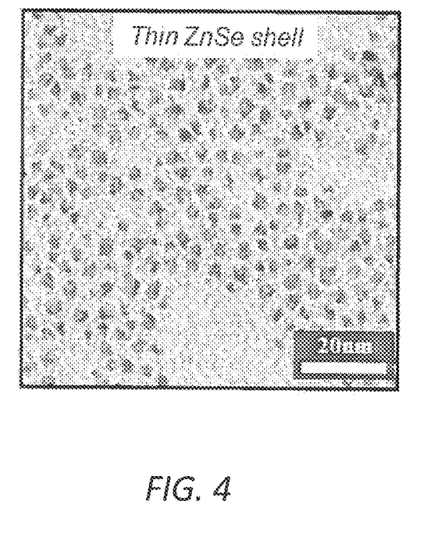
FIG. 4 is a TEM image of the InP core particles with a thin ZnSe shell from the examples.

Synthesis of InP-Based Core/Shell Quantum Dots and Thin Layer InP/ZnSe Core Shell Quantum Dots An indium precursor, a zinc precursor, a fatty acid (such as myristic acid) and an alkane solvent were loaded into a three-neck flask to form mixture 1. Argon gas was passed into the flask and mixture 1 was mixed for 5-10 minutes at room temperature. Then mixture 1 was heated to 50-200° C., and the phosphorous precursor solution was injected at this temperature to form mixture 2. FIG. 3 shows a transmission electron microscope (TEM) image of the InP core particles contained in mixture 2, showing the particles have a diameter of about 1.5 nm. Mixture 2 was heated up to 230-320° C. and a selenium precursor solution was added to form mixture 3. After reacting to reach a certain degree, the reaction was stopped by removing the heating jacket and allowing the final reaction mixture to cool, the final reaction mixture being mixture 4. FIG. 4 shows a TEM image of the InP core particles with a thin ZnSe shell that are contained in mixture 4, showing the particles have a diameter of about 3 nm, which equates to a growth of about 2 monolayers of ZnSe.

Purification of Thin-Shell InP/ZnSe Core Shell Quantum Dots

Mixture 4 was cooled down to about 50° C., and then hexane and methanol were added, and octylamine was injected into the mixture 4 to form mixture 5. Mixture 5 was mixed for a time period, the mixing was stopped, and mixture 5 was allowed to settle. After the methanol and hexane phase were separated, the lower layer of the solution (methanol phase) was extracted out and the operation was repeated, but without octylamine being added and with argon gas being bubbled in the flask to remove the hexane. Then a certain amount of acetone was added to complete the precipitation of the quantum dots, and then such mixture was centrifuged, and, after discarding the supernatant, the precipitate was dissolved again in hexane. Acetone was added for precipitation of the QDs again, and, after centrifugation the supernatant was discarded, and the precipitated QDs were set aside for later use.

Figure 5:
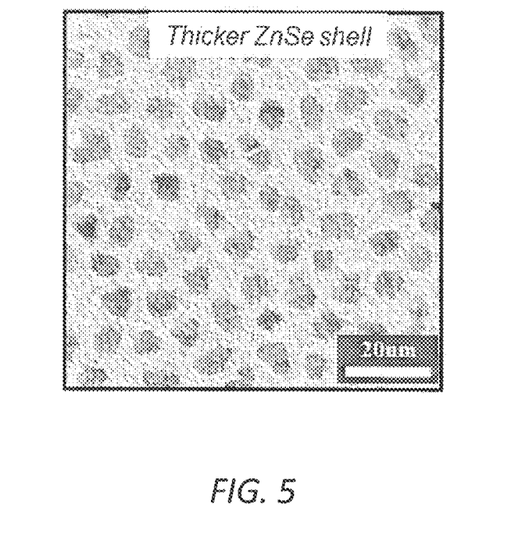
FIG. 5 is a TEM image of the InP core particles with a thicker ZnSe shell (i.e., a thick ZnSe shell formed on the thin ZnSe shell) from the examples.

Synthesis of Thick Shell Indium Phosphide/Zinc Selenide (InP/ZnSe) Core/Shell Quantum Dots:

Alkane solvent was loaded into three-neck flask and argon gas was bubbled therethrough for a period of time. The purified thin shell InP/ZnSe core/shell quantum dots were injected into the alkane solvent. Fatty acid and zinc carboxylate were injected to form mixture 6, the mixture 6 was heated up to 240-320° C. and reacted for 5 minutes. Then selenium precursor solution was dropwisely added to the mixture 6; after 5 minutes reaction and one monolayer growth of ZnSe layer ended, a final mixture, mixture 7, is produced. Mixture 7 was cooled down to below 180° C. again, and zinc carboxylate was injected, mixture 7 was heated up to 240-320° C. for 5 minutes of reaction, then selenium precursor solution was dropwisely added to the mixture at the elevated temperature, and the reaction time was 5 minutes. The thermal cycling method was applied in subsequent growth of ZnSe monolayers. Only the amount of zinc carboxylate solution and selenium precursor solution required for injection of each monolayer was changed respectively. Finally, the reaction was stopped by removing the heating jacket and allowing the final reaction mixture to cool, the final reaction mixture is called mixture 8. FIG. 5 shows a TEM image of the InP core particles with a thick ZnSe shell that are contained in mixture 8, showing the particles have a total growth of about 8 monolayers of ZnSe.

Figure 6:
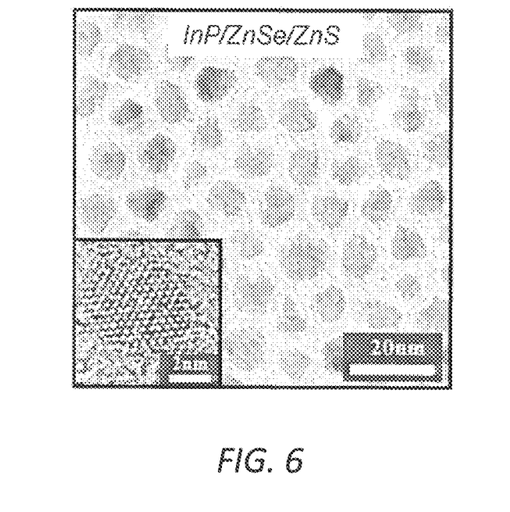
FIG. 6 is a TEM image of the InP core/thicker ZnSe shell/ZnS shell particles from the examples.

Synthesis of Indium Phosphide/Zinc Selenide/Zinc Sulfide (InP/ZnSe/ZnS) Core/Shell Quantum Dots The thick shell layer InP/ZnSe quantum dots solution (mixture 8) was cooled down to below 180° C., and zinc carboxylate solution was injected, then the mixture 8 was heated up to 240-320° C. for 5 minutes reaction. A sulfur precursor solution was then added, and the thermal cycling method was also applied in subsequent growth of ZnS layers, to produce mixture 9. FIG. 6 shows a TEM image of the InP core/thick ZnSe shell/ZnS shell particles that are contained in mixture 9. The inset of FIG. 6 show a high resolution TEM image that indicates that the particles contained in mixture 9 are single crystalline, indicating that the growth of the shells on the core particles occurred epitaxially.

The mixture 9 was cooled to about 50° C. hexane and methanol were added, and then injected with aliphatic amine (such as octylamine) to form mixture 10. The mixture 10 was mixed well, the mixing was stopped, and mixture 10 was allowed to settle. After the methanol phase and hexane phase were separated, the lower layer of the solution (methanol phase) was extracted out and the operation was repeated, but without octylamine. The mixture was stirred and bubbled with argon gas to remove hexane, and a purified solution, mixture 11, is produced.

Further Growth of ZnS Shell

A certain amount of fatty acid and aliphatic amine and 1-2 mL alkane solvent were prepared and the mixture had argon gas bubbled therein for 5-10 minutes. The purified solution of mixture 11 was injected into the mixture of aliphatic amine, fatty acid, and alkane solvent to form mixture 12. Mixture 12 was heated up to 240-320° C. and then sulfur precursor solution was injected for 5-10 minutes of reaction; zinc carboxylate was injected for 5-10 minutes of reaction. This operation was repeated under that temperature until the required layer thickness was achieved at which point the reaction was stopped by cooling.

Figure 7:
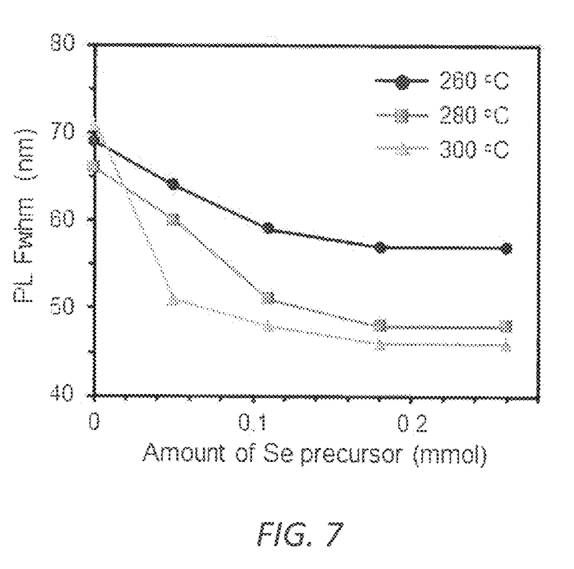
FIG. 7 is a plot of the effect that the temperature and the amount of Se precursor during the growth of the thick shell of ZnSe has on the PL peak full width at half maximum (FWHM) value for the experimental conditions described in the examples.
Figure 8:
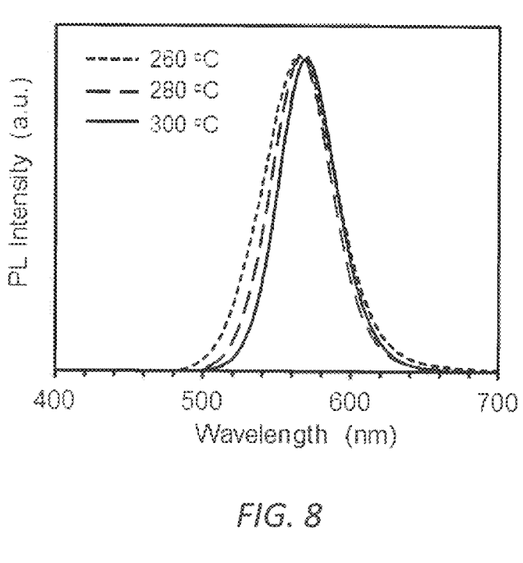
FIG. 8 depicts the FL spectra of InP/ZnSe QDs grown at different temperatures under the same conditions.

FIG. 7 depicts a plot of the effect that the temperature and the amount of Se precursor during the growth of the thick shell of ZnSe has on the PL peak full width at half maximum (FWHM) value for the experimental conditions described above. FIG. 8 depicts the PL spectra of InP/ZnSe QDs grown at different temperatures under the same conditions, showing that the FWHM value shrinks from the high energy side (e.g., lower wavelength (nm) values) as the temperature is increased.

Figure 9:
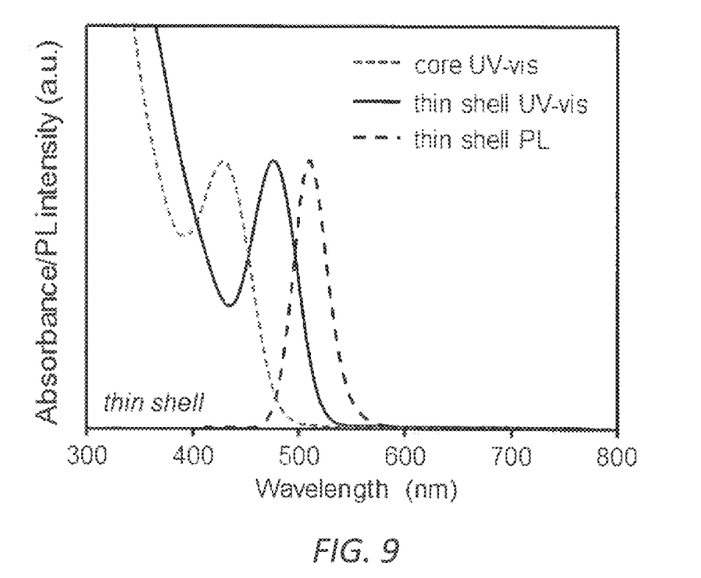
FIG. 9 depicts a plot of the UV-Vis spectra of the InP core and the InP/ZnSe having a thin shell, and a plot of the PL spectra of the InP/ZnSe having a thin shell.

FIG. 9 depicts a plot of the UV-Vis spectra of the InP core and the InP/ZnSe having a thin shell, and a plot of the PL spectra of the InP/ZnSe having a thin shell (e.g., comparable to particles in mixture 4 described above).

Figure 10:
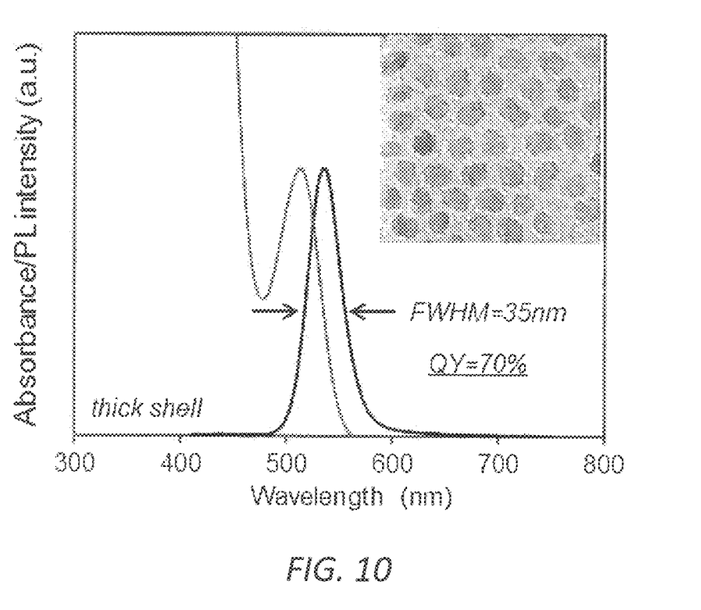
FIG. 10 depicts a plot of the UV-Vis spectra of the InP core and the InP/ZnSe having a thick shell.

FIG. 10 depicts plots of the PL and UV-Vis spectra of InP/ZnSe having a thick shell (e.g., comparable to particles in mixture 8 described above). The data in FIG. 10 shows that the PL FWHM of the thick-shell InP/ZnSe core/shell QDs can be greatly reduced from 55 nm (for the thin shell InP/ZnSe shown in FIG. 9) to 35 nm though no significant shift of the low-energy side was observed. The inset shows a TEM image of the thick shell particles showing their relative diameter to be about 6.6 nm with about 8 monolayers of ZnSe shell.

Figure 11:
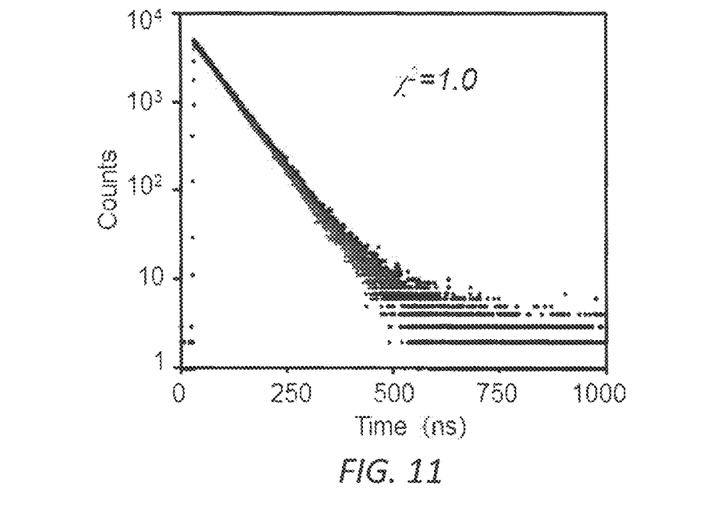
FIG. 11 shows that the PL decay dynamics of the final InP-based core/shell QDs.

FIG. 11 shows that the PL decay dynamics of the final InP-based core/shell QDs can be made as single-exponential. The goodness-of-fit ($\chi^2$) using single-exponential fitting with high photon counts (5000) could be close to 1.0. In general, single-exponential decay dynamics indicates excellent control of the photo-generated excitons, which is something that has only previously been observed in CdSe-based QDs.

Figure 12:
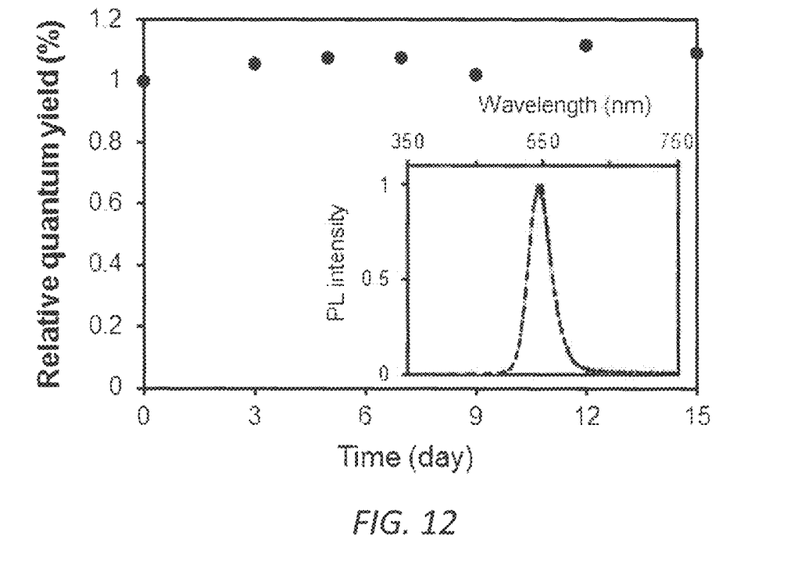
FIG. 12 shows relative quantum yield data from UV-PL spectra of a sample of the InP/ZnSe/ZnS core/shell/shell QDs as synthesized and after exposure in air for up to fifteen days.

FIG. 12 shows relative quantum yield data from UV-PL spectra of a sample of the InP/ZnSe/ZnS core/shell/shell QDs as synthesized and after exposure in air for up to fifteen days. The inset spectra indicate that the InP/ZnSe/ZnS core/shell/shell QDs exhibit great photoluminescence stability with regard to extended storage as the photoluminescence did not change (i.e., there are two roughly completely overlapping plots in the inset).

Figure 13:
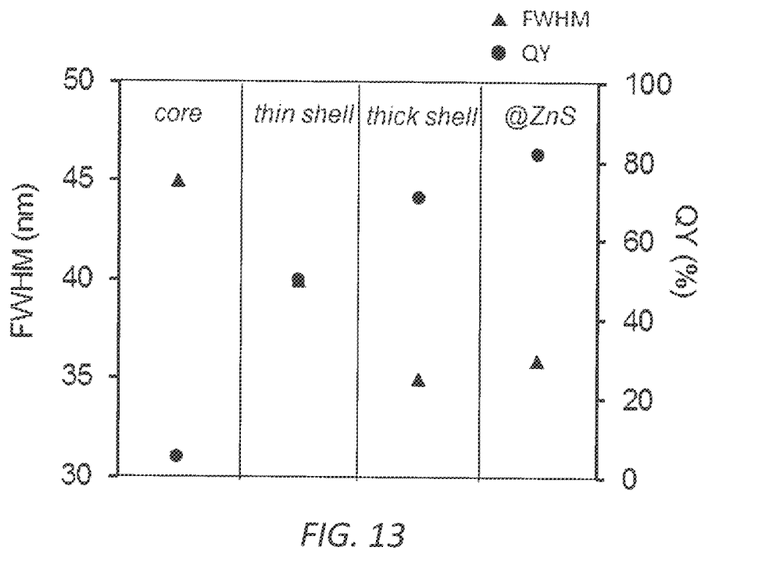
FIG. 13 shows a plot summarizing the FWHM and QY for the particles discussed in the Examples.

FIG. 13 shows a plot summarizing the FWHM and QY for the particles discussed above. Specifically, "core" refers to the InP core, "thin shell" refers to the InP with a thin shell of ZnSe, "thick shell" refers to the InP with a thick shell of ZnSe, and "@ZnS" refers to the InP/ZnSe/ZnS.

Application of the QDs

The QDs of the present application may be photoluminescent, electroluminescent, or both, and may be used in any of the following products. Photoluminescent products may comprise quantum dots and resin, and such products can be applied in the display field, lighting field, or solar cells.

A typical display device may include a light source module, a light guide, a quantum dot film, and a display panel. The display panel may be, for example, a liquid crystal panel or the like. Light emitted from the light source module may enter the side of the light guide, exit through the light-exiting side of the light guide, pass the quantum dot film, and illuminate the rear side of the display panel.

Another typical display device may include a light source module, a light guide, and a display panel. The light source module may include a light emitting element package and a quantum dot tube disposed in a light emitting direction of the light emitting element package. With respect for the quantum dot tube, a quantum dot mixture manufactured in a method according to embodiments may be sealed inside the package.

Electroluminescent products called quantum dot light emitting diode (QLED) includes an anode, an emission layer, and a cathode, which may be sequentially stacked on a substrate. Preferably, the QLED includes the anode, a hole injection layer (HIL), a hole transport layer (HTL), the emission layer, an electron transport layer (ETL), and the cathode which may be sequentially stacked on a substrate.

QDs of the present application may also be variously developed and applied to bioscience such as detection device or diagnosis device, solar cell device, or the like.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A process for producing group III-V quantum dots, comprising:
    heating a mixture of group II and group III element precursors in a solution;
    adding a group V element precursor to the mixture and heating to form a first solution containing group III-V quantum dot cores;
    adding a first group VI element precursor to the first solution to form group III-V/group II-VI core/shell particles;
    purifying the group III-V/group II-VI core/shell particles;
    dispersing the purified group III-V/group II-VI core/shell particles in a second solution;
    adding activation agent and a group II element precursor to the second solution;
    heating the second solution; and
    adding a second group VI element precursor to the heated second solution to form group III-V/group II-VI/group II-VI core/shell/shell particles.

2. The process of claim 1, wherein in the group III-V/group II-VI/group II-VI core/shell/shell particles the shells of group II-VI are the same compounds or are different compounds.

3. The process of claim 1, wherein in the group III-V/group II-VI core/shell particles the thickness of the group II-VI shell is less than about 4 monolayers.

4. The process of claim 1, wherein in the group III-V/group II-VI/group II-VI core/shell/shell particles the thickness of the outer group II-VI shell is greater than about 4 monolayers.

5. The process of claim 1, wherein the solution of the mixture of group II and group III element precursors is heated to about 50-200° C. during the heating.

6. The process of claim 1, wherein the first solution containing group III-V quantum dot cores is heated to about 200-360° C. either before or after adding the group VI precursor to the first solution.

7. The process of claim 1, wherein the purifying comprises:
    adding hexane and/or toluene, methanol and/or ethanol, and an aliphatic amine to a solution containing the group III-V/group II-VI core/shell particles with mixing;
    halting the mixing and separating a lower phase containing methanol and/or ethanol from a hexane and/or toluene phase;
    precipitating the group III-V/group II-VI core/shell particles from the hexane and/or toluene phase by adding acetone to collect purified group III-V/group II-VI core/shell particles;
    optionally centrifuging the group III-V/group II-VI core/shell particles in the hexane and/or toluene phase after addition of acetone.

8. The process of claim 7, wherein the purifying is performed up to four times.

9. The process of claim 1, wherein the activation agent is at least one of a fatty acid or a diketone.

10. The process of claim 1, wherein the molar concentration of activation agent added to the second solution is about 100-1000 times the concentration of the purified group III-V/group II-VI core/shell particles present.

11. The process of claim 1, wherein the second solution is heated to about 200-360° C. during the heating.

12. The process of claim 1, wherein the amount of group II element precursor and group VI element precursor added to the second solution are modulated to form between 1 and 2 monolayers of group II-VI shell on the purified group III-V/group II-VI core/shell particles.

13. The process of claim 12, wherein the sequence of adding activation agent and group II element precursor and adding group VI element precursor to the second solution is repeated at least one time.

14. The process of claim 13, wherein a group VI element precursor that is chemically different than the second group VI element precursor initially added to the second solution is added during at least one repeat of the sequence.

15. The process of claim 1, wherein the group III element precursor is at least one compound selected from aluminum phosphate, aluminum acetylacetonate, aluminum chloride, aluminum fluoride, aluminum oxide, aluminum nitrate, aluminum sulfate, aluminum carboxylate, gallium acetylacetonate, gallium chloride, gallium fluoride, gallium oxide, gallium nitrate, gallium sulfate, gallium carboxylate, trimethyl indium, indium acetate, indium chloride, indium bromide, indium iodide, indium acetylacetonate, indium oxide, indium nitrate, indium sulfate, and indium carboxylate.

16. The process of claim 1, wherein the group V element precursor is at least one compound selected from alkyl phosphine, tris(trialkylsilyl) phosphine, tris(dialkylsilyl) phosphine, tris(dialkylamino) phosphine, tris(trialkylsilyl) arsine, tris(dialkylsilyl) arsine, tris(dialkylamino) arsine.

17. The process of claim 1, wherein the group II element precursor is at least one compound selected from zinc acetate, dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, cadmium oxide, dimethyl cadmium, diethyl cadmium, cadmium carbonate, cadmium acetate dihydrate, cadmium acetylacetonate, cadmium fluoride, cadmium chloride, cadmium iodide, cadmium bromide, cadmium perchlorate, cadmium phosphide, cadmium nitrate, cadmium sulfate, cadmium carboxylate.

18. The process of claim 1, wherein the first and second group VI element precursor are each individually at least one compound selected from sulfur powder, trialkylphosphine sulfide, trialkenylphosphine sulfide, triphenylphosphine sulfide, diphenylphosphine sulfide, phenylphosphine sulfide, alkylamino sulfide, alkenylamino sulfide, alkylthiol, selenium powder, trialkylphosphine selenide, trialkenylphosphine selenide, triphenylphosphine selenide, diphenylphosphine selenide, phenylphosphine selenide, alkylamino selenide, alkenylamino selenide, trialkylphosphine telluride, trialkenylphosphine telluride, alkylamino telluride, and alkenylamino telluride.

19. Group III-V quantum dots, comprising:
    quantum dots produced by a process, comprising:
    heating a mixture of group II and group III element precursors in a solution;

adding a group V element precursor to the mixture and heating to form a first solution containing group III-V quantum dot cores;

adding a first group VI element precursor to the first solution to form group III-V/group II-VI core/shell particles;

purifying the group III-V/group II-VI core/shell particles;

dispersing the purified group III-V/group II-VI core/shell particles in a second solution;

adding activation agent and a group II element precursor to the second solution;

heating the second solution; and adding a second group VI element precursor to the heated second solution to form group III-V/group II-VI/group II-VI core/shell/shell particles.

20. The group III-V quantum dots of claim 19, wherein the group III-V quantum dot cores have a diameter less than about 20 nm.

21. The group III-V quantum dots of claim 19, wherein the group III-V quantum dots have a peak in the photoluminescence spectra that exhibits a peak with a full width at half-maximum intensity of less than about 55 nm.

\* \* \* \* \*